United States Patent
Coolbaugh et al.

(10) Patent No.: US 7,687,867 B2
(45) Date of Patent: Mar. 30, 2010

(54) INEXPENSIVE METHOD OF FABRICATING A HIGHER PERFORMANCE CAPACITANCE DENSITY MIMCAP INTEGRABLE INTO A COPPER INTERCONNECT SCHEME

(75) Inventors: Douglas D. Coolbaugh, Essex Junction, VT (US); Ebenezer E. Eshun, Essex Junction, VT (US); Zhong-Xiang He, Essex Junction, VT (US); William J. Murphy, North Ferrisburgh, VT (US); Vidhya Ramachandran, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 11/846,248

(22) Filed: Aug. 28, 2007

(65) Prior Publication Data

US 2007/0290359 A1    Dec. 20, 2007

Related U.S. Application Data

(62) Division of application No. 10/709,829, filed on Jun. 1, 2004, now Pat. No. 7,282,404.

(51) Int. Cl.
*H01L 29/72*    (2006.01)
(52) U.S. Cl. .................. 257/401; 257/532; 257/535
(58) Field of Classification Search .............. 257/401, 257/532, 535
See application file for complete search history.

(56) References Cited

U.S. PATENT DOCUMENTS

| | | | |
|---|---|---|---|
| 5,339,212 A | 8/1994 | Geffken et al. | |
| 6,180,976 B1 * | 1/2001 | Roy ........................... | 257/306 |
| 6,255,233 B1 | 7/2001 | Smith et al. | |
| 6,259,128 B1 | 7/2001 | Adler et al. | |
| 6,261,952 B1 | 7/2001 | Ngo et al. | |
| 6,319,767 B1 | 11/2001 | Cha et al. | |
| 6,344,964 B1 | 2/2002 | Adler | |
| 6,350,672 B1 | 2/2002 | Sun | |
| 6,387,770 B2 | 5/2002 | Roy | |
| 6,881,999 B2 | 4/2005 | Lee et al. | |
| 2002/0086492 A1 | 7/2002 | Tsau | |
| 2002/0089810 A1 | 7/2002 | Casper et al. | |
| 2002/0094656 A1 | 7/2002 | Armacost et al. | |
| 2002/0130388 A1 | 9/2002 | Stamper | |
| 2002/0151150 A1 | 10/2002 | Bernstein et al. | |

(Continued)

*Primary Examiner*—Edward Wojciechowicz
(74) *Attorney, Agent, or Firm*—Scully, Scott, Murphy & Presser, P.C.; Anthony J. Canale

(57) ABSTRACT

A method to integrate MIM capacitors into conductive interconnect levels, with low cost impact, and high yield, reliability and performance than existing integration methods is provided. This is accomplished by recessing a prior level dielectric for MIM capacitor level alignment followed by deposition and patterning of the MIM capacitor films. Specifically, the method includes providing a substrate including a wiring level, the wiring level comprising at least one conductive interconnect formed in a dielectric layer; selectively removing a portion of the dielectric layer to recess the dielectric layer below an upper surface of the at least one conductive interconnect; forming a dielectric stack upon the at least one conductive interconnect and the recessed dielectric layer; and forming a metal-insulator-metal (MIM) capacitor on the dielectric stack. The MIM capacitor includes a bottom plate electrode, a dielectric and a top plate electrode. The bottom and top plate electrodes can comprise the same or different conductive metal.

11 Claims, 4 Drawing Sheets

U.S. PATENT DOCUMENTS

| | | |
|---|---|---|
| 2002/0155676 A1 | 10/2002 | Stetter et al. |
| 2002/0192919 A1 | 12/2002 | Bothra |
| 2002/0197844 A1 | 12/2002 | Johnson et al. |
| 2003/0006480 A1 | 1/2003 | Lian et al. |
| 2003/0178696 A1 | 9/2003 | Adler et al. |
| 2004/0036098 A1 | 2/2004 | Fujiki et al. |

* cited by examiner

INEXPENSIVE METHOD OF FABRICATING A HIGHER PERFORMANCE CAPACITANCE DENSITY MIMCAP INTEGRABLE INTO A COPPER INTERCONNECT SCHEME

RELATED APPLICATION

This application is a divisional of U.S. patent application Ser. No. 10/709,829, filed Jun. 1, 2004.

FIELD OF THE INVENTION

The present invention generally relates to semiconductor devices, and more particularly to a metal-insulator-metal (MIM) capacitor that can be used with an interconnect structure containing conductive wiring.

BACKGROUND OF THE INVENTION

In the semiconductor industry, high performance capacitors are in great demand since such capacitors are essential for numerous applications, including, for example, RF and microwave. High performance capacitors have greater densities than a conventional capacitor, which leads to a reduction in chip size. Metal-insulator-metal (MIM) capacitors that are formed above back-end-of-the line (BEOL) metallurgy are also known.

For example, there are several existing schemes for integrating MIM capacitors with Cu interconnects. The current working scheme employs three masks for the fabrication of the MIM capacitor and TiN films are employed as the upper and lower electrode of the MIM capacitor. Because of the high resistivity associated with TiN electrodes, the prior art schemes typically exhibit high parasitic series resistance which strongly limits the performance of the devices, especially at higher frequency.

In some prior art applications, a thin layer of Al was added to the Ti stack in order to reduce this series resistance. This solution is not viable because of the severe roughness issues of an Al layer. Roughening of the bottom plate would limit the reliability of the MIM capacitor.

As the semiconductor industry introduces thinner and more exotic films into their capacitor structures embedded in interconnect layers that have higher capacitance density, the MIM capacitor functionality and reliability are diminished because the roughness causes early breakdown of the MIM capacitor dielectric by dielectric stress and field concentration. Moreover, most prior art integration schemes include an extra mask for assisting alignment of the MIM capacitor masks to the underlying metal level.

Additionally, it is highly desirable to enable higher capacitance density to reduce planar space usages by MIM capacitors, which can run into millions of square microns adding chip area and cost.

In view of the drawbacks with the prior art mentioned above, there is a need for providing an inexpensive method of fabricating higher performance, higher capacitance density MIM capacitors that can be integrated into an interconnect scheme.

SUMMARY OF THE INVENTION

The present invention provides a method to integrate MIM capacitors into conductive interconnect levels, with low cost impact, and high yield, reliability and performance than existing integration methods. This is accomplished in the inventive method by recessing a prior level dielectric for MIM capacitor level alignment followed by deposition and patterning of the MIM capacitor films. Specifically, and in broad terms, the method of the present invention comprises the steps of:

providing a substrate including a wiring level, the wiring level comprising at least one conductive interconnect formed in a dielectric layer;

selectively removing a portion of the dielectric layer to recess the dielectric layer below an upper surface of the at least one conductive interconnect;

forming a dielectric stack upon the at least one conductive interconnect and the recessed dielectric layer; and forming a metal-insulator-metal (MIM) capacitor on the dielectric stack.

The MIM capacitor includes a bottom plate electrode, a capacitor dielectric and a top plate electrode. The bottom and top plate electrodes can comprise the same or different conductive metal. The conductive metal includes any high melting point conductor (i.e., refractory metal).

The present invention also relates to a semiconductor structure that comprises:

a substrate including a wiring level, the wiring level comprising at least one conductive interconnect located in a recessed dielectric layer, wherein said at least one conductive interconnect has an upper surface that is located above an upper surface of said recessed dielectric layer;

a dielectric stack located on said upper surface of said at least one conductive interconnect and said upper surface of said recessed dielectric layer; and a MIM capacitor located on said dielectric stack.

DETAILED DESCRIPTION OF THE INVENTION

Figure 1A:
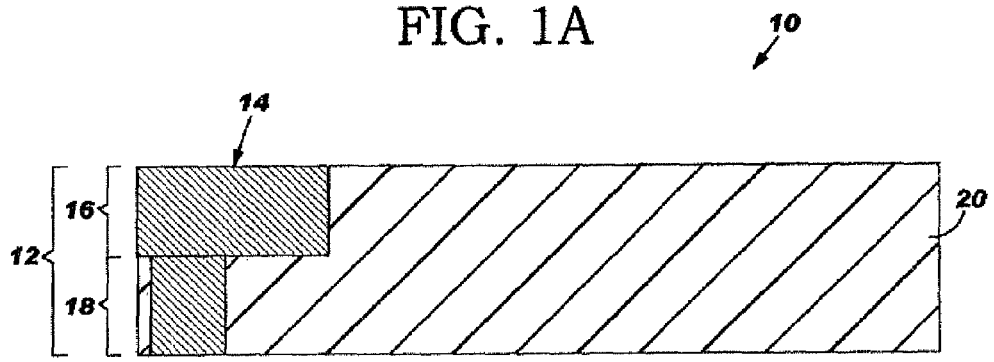
FIGS. 1A-1G are pictorial representations (through cross sectional views) illustrating the basic processing steps that are employed in the inventive method.

The present invention, which provides an inexpensive method of fabricating a higher performance, higher capacitance density MIM capacitor that is capable of being integrated into an interconnect scheme, will now be described in greater detail by referring to the drawings that accompany the present application. In particular, reference is made to FIGS. 1A-1G which illustrate the basic processing steps that are employed in the present invention. In the drawings that follow, the structure shown can be the first interconnect level which is formed atop a semiconductor substrate containing active devices, or alternatively, it can be any other interconnect level within an interconnect structure. It is also worth noting that although the drawings illustrate a single MIM capacitor within the structure, the present invention is not limited to that structure. Instead, a structure including multiple MIM capacitors is also contemplated herein.

Reference is first made to FIG. 1A, which shows an initial structure 10 that can be employed in the present invention. The initial structure 10 includes a wiring level 12 that comprises at least one conductive interconnect 14 located in a dielectric layer 20. The conductive interconnect 14 includes a line region 16 and a via region 18 that are filled with a conductive metal such as, for example, Cu, W or Al. Copper (Cu) is most preferred and is the conductive metal presently being employed in today's interconnect structures. Although one conductive interconnect 14 is shown, the dielectric layer 20 may include a plurality of such conductive interconnects therein.

The dielectric layer 20 comprises any organic or inorganic insulating material, both of which are well known to those skilled in the art. The dielectric layer 20 is typically, but not necessarily, a low-k dielectric. The term "low-k" denotes an insulator having a dielectric constant, as determined in a vacuum, of about 4.0 or less, preferably less than 3.0. The dielectric layer 20 may be a porous dielectric or a non-porous dielectric. The dielectric layer 20 can be a single dielectric material or it may be composed of a plurality of dielectrics. Typically, the dielectric layer 20 is an oxide such as $SiO_2$.

The initial structure 10 shown in FIG. 1A is formed utilizing conventional processes well known to those skilled in the art including, for example, a single or dual damascene process or a subtractive process. Although not shown, a liner such as TiN, Ti, Ta, and TaN may optionally be present between the conductive interconnect 14 and the dielectric layer 20.

Figure 1B:
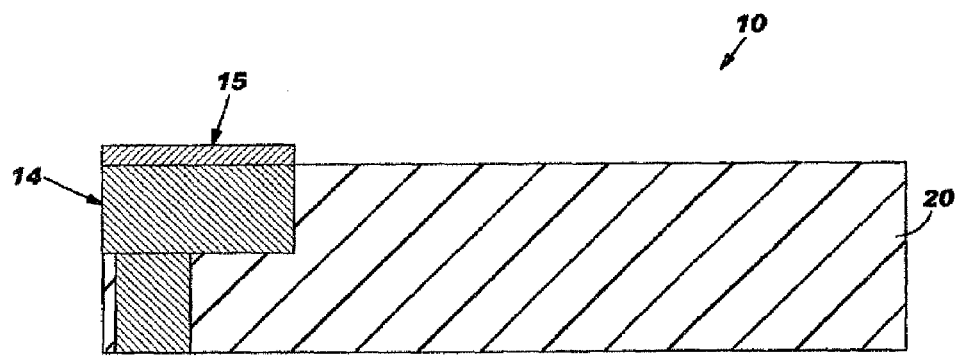

Next, and as shown in FIG. 1B, the initial structure 10 of FIG. 1A is subjected to an etching process that selectively removes a portion of the dielectric layer 20 to recess the dielectric layer 20 below an upper surface 15 of conductive interconnect 14. This etching step may be performed utilizing any etching process, dry or wet, that can selectively remove dielectric as compared to conductive material. Preferably, the etching is performed utilizing a wet etch process such as a dilute HF dip.

As shown in FIG. 1B, the planar structure of FIG. 1A has been modified such that the upper surface 15 of the conductive interconnect 14 extends above the recessed surface of the dielectric layer 20. The amount of recessing of the dielectric layer 20 may vary, but typically the dielectric layer 20 is recessed from about 100 Å to about 500 Å, below the upper surface 15 of the conductive interconnect 14.

It is noted that this step of the present invention is not typically performed in prior art MIM capacitor integration schemes. Instead, in the prior art, the structure shown in FIG. 1A is used directly for integration. By providing the structure shown in FIG. 1B, the method of the present invention eliminates one mask from prior art integration schemes. It is noted that the selective removal step described above re-exposes the alignment mark patterned in the current interconnect level (not shown). Re-exposing the alignment mark does not occur in prior art integration schemes.

Figure 1C:
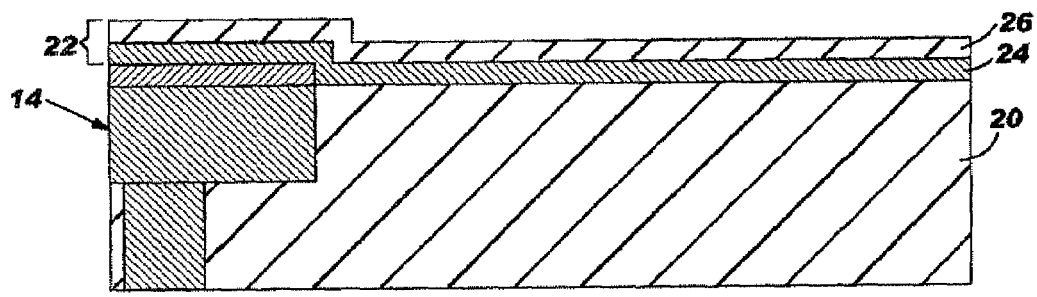
Figure 1D:
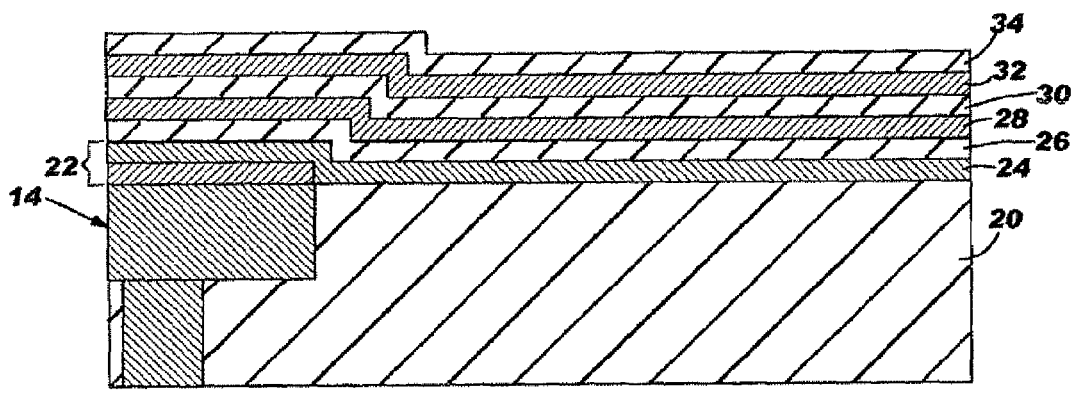
Figure 1E:
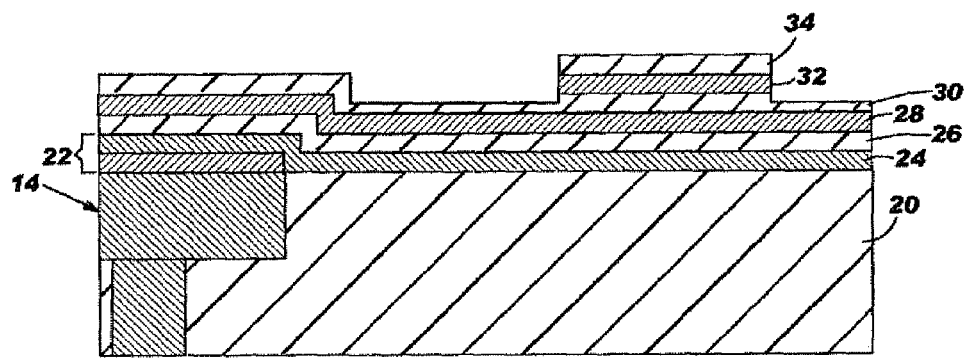

After recessing the structure of FIG. 1A to provide a mesa surface of conductive interconnect that extends above the recessed surface of dielectric layer 20, a dielectric stack 22 is formed atop the structure. The dielectric stack 22 may comprise one or more insulating oxides, nitrides and/or oxynitrides. FIG. 1C depicts an embodiment of the present invention in which the dielectric stack 22 comprises a nitride cap 24 and a sacrificial oxide 26.

The dielectric stack 22 can be formed by a conventional deposition process such as, for example, chemical vapor deposition (CVD), plasma-enhanced chemical vapor deposition (PECVD), atomic layer deposition, evaporation, chemical solution deposition and the like. A single deposition process can be employed, or alternatively, multiple deposition processes can be employed in forming the dielectric stack 22.

The thickness of the dielectric stack 22 may vary depending on the type of insulating material being deposited as well as the number of layers within the dielectric stack 22 itself. Typically, dielectric stack 22 has a thickness, after deposition, from about 35 nm to about 300 nm, with a thickness from about 50 nm to about 100 nm being more typical. In the specific embodiment depicted in FIG. 1C, the dielectric stack 22 contains a nitride cap 24 that has a thickness from about 35 nm to about 50 nm, and a sacrificial 26 oxide that has a thickness from about 50 nm to about 100 nm.

Next, the various layers that comprise the MIM capacitor of the present invention as well as an etch stop layer are formed atop the structure shown in FIG. 1C. Specifically, and as shown, for example, in FIG. 1D, a bottom plate electrode 28, a capacitor dielectric 30, a top plate electrode 32 and an etch stop layer 34 are sequentially deposited, one atop the other, on the structure shown in FIG. 1C.

The bottom plate electrode 28 is first formed on the upper surface of dielectric stack 22 utilizing a deposition process including, but not limited to: sputtering, plating, evaporation, chemical vapor deposition (CVD), plasma-enhanced CVD, chemical solution deposition, atomic layer deposition and other like deposition processes. The thickness of the bottom plate electrode 28 may vary depending upon the type of conductive material employed as well as the deposition process that is used in forming the same. Typically, the bottom plate electrode 28 has a thickness from about 500 Å to about 7000 Å.

The bottom plate electrode may be comprised of any conductive metal or metal alloy including, for example, TiN, Ti, TiSiN, TaN, Pt, Ir, Ru, W, Al, Au, Cu, Ta, TaSiN and mixtures, e.g., alloys, and multilayers thereof. These materials are characterized as being high melting point refractory materials. For example, the bottom plate electrode 28 can be comprised of a metal stack comprising layers of TiN/W/TiN. In the TiN/W/TiN stack, the TiN retards metal diffusion into the W. Preferably, the bottom plate electrode is comprised of TiN/W/TiN, Al, Al alloys, Cu and Cu alloys. In one highly preferred embodiment, TiN/W/TiN is used as the bottom plate electrode 28. In this embodiment, the TiN layer has a thickness from about 100 Å to about 300 Å, the W layer has a thickness from about 500 Å to about 1000 Å, and the TiN layer has a thickness from about 100 Å to about 300 Å.

After forming the bottom plate electrode 28, capacitor dielectric 30 is formed on the upper surface of the bottom plate electrode. The capacitor dielectric 30 is formed utilizing a conventional deposition process such as, for example, CVD, PECVD, evaporation, chemical solution deposition, atomic layer deposition, and other like processes. The thickness of the capacitor dielectric 30 is typically from about 150 Å to about 1500 Å, with a thickness from about 350 Å to about 1000 Å being more typical.

The capacitor dielectric 30 is comprised of any insulator material that is used in a conventional MIM capacitor. Illustrative examples of insulators that can be employed as the capacitor dielectric 30 include oxides, nitrides and/or oxynitrides. Preferably, the capacitor dielectric 30 is a nitride such as SiN, or an oxide such as, for example, $SiO_2$, $Al_2O_3$, $HFO_2$, $SiO_xN_y$, $HFSiO_x$.

The top plate electrode 32 is then formed atop the capacitor dielectric 30. The top plate electrode 32 is formed utilizing one of the methods mentioned above in regard to the bottom plate electrode 28. The thickness of the top plate electrode 32 may vary depending upon the type of conductive material employed as well as the deposition process that is used in forming the same. Typically, the top plate electrode 32 has a thickness that is the range mentioned above for the bottom plate electrode 28, i.e., a range from about 500 Å to about 7000 Å.

The top plate electrode 32 may be composed of the same or different conductive material as the bottom plate electrode 28. Thus, it is possible in the present invention to have the top and bottom plate electrodes be composed of the same conductive material, or the bottom plate electrode 28 may be composed of one conductive material, while the top plate electrode 32 is composed of another conductive material that differs from that of the bottom plate electrode 28. Illustrative examples of conductive materials for the top plate electrode 32 include, but are not limited to: TiN, Ti, TiSiN, TaN, Pt, Ir, Ru, W, Al, Au, Cu, Ta, TaSiN and mixtures, e.g., alloys, and multilayers thereof. In one highly preferred embodiment, the top plate electrode is comprised of TiN. In the preferred embodiment, the TiN top plate electrode has a thickness from about 500 Å to about 5000 Å. In such an embodiment in which the top plate electrode is comprised of TiN, the bottom plate include is preferably comprised of TiN/W/TiN.

After forming MIM capacitor layers 28, 30, and 32, an etch stop layer 34 is then formed on the upper surface of top electrode 32. The etch stop layer 34 is comprised of a nitride or equivalent insulating material. The etch stop layer 34 is formed utilizing a conventional deposition process such as, for example, evaporation, CVD, PECVD, chemical solution deposition, atomic layer deposition and the like. The thickness of the etch stop layer 34 may vary depending on the type of etch stop material employed as well as the technique used in forming the same. Typically, the etch stop layer 34 has a thickness from about 150 Å to about 2000 Å.

At this point of the present invention, at least the top plate electrode 32 is patterned by lithography and etching. The lithography step includes applying a photoresist (not shown) to the etch stop layer 34, exposing the photoresist to a pattern of radiation and developing the pattern into the photoresist utilizing a conventional resist developer. Following patterning of the photoresist, the desired pattern is transferred first to the etch stop layer 34 utilizing an etching process that selectively etches the exposed portions of the etch stop layer 34. The photoresist is typically removed by a conventional stripping process and pattern transfer continues using the patterned etch stop layer 34 as a patterned mask. The etching removes portions of the top plate electrode, while not removing other portions that are protected by the patterned etch stop layer The etching used in patterning at least the top plate electrode 32 includes a dry etching process, a wet etching process or any combination thereof. In some embodiments, this etching step may also thin the exposed portions of capacitor dielectric layer 30. Although thinning of the capacitor dielectric layer 30 may occur, the etching is stopped when the capacitor dielectric layer 30 is reached. The structure that is formed after patterning of at least the top plate electrode 32 is shown, for example, in FIG. 1E.

Next, at least the bottom plate electrode 28 is patterned by lithography and etching. In this step, a second patterned photoresist is employed and etching removes the exposed portions of the capacitor dielectric 30 as well as underlying portions of the bottom plate electrode 28, stopping somewhere within the dielectric stack 22. In this embodiment not shown, this etching step stops within the sacrificial oxide 26.

Figure 1F:
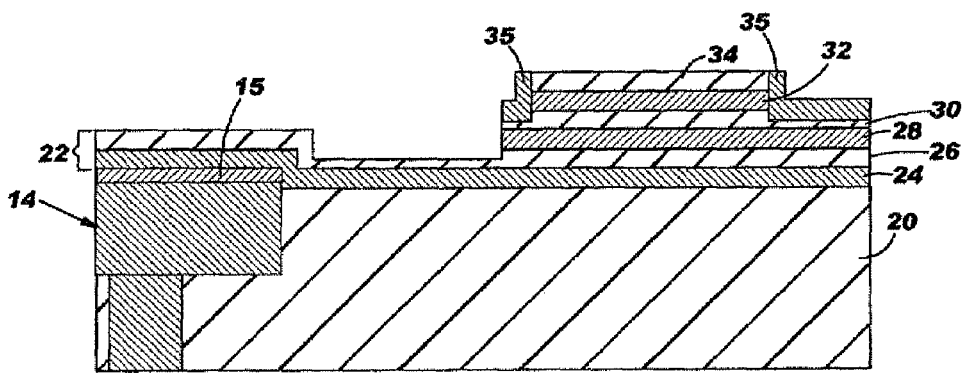

In another embodiment and as depicted in FIG. 1F, additional etch stop material 35 is formed atop the patterned etch stop layer 34 as well as atop the thinned capacitor dielectric 30, prior to patterning the bottom plate electrode 28. Note that the additional etch stop material 35 protects the previously patterned top plate electrode 32 from being attached during etching of the bottom plate electrode 28. This embodiment is highly preferred in the present invention.

Figure 1G:
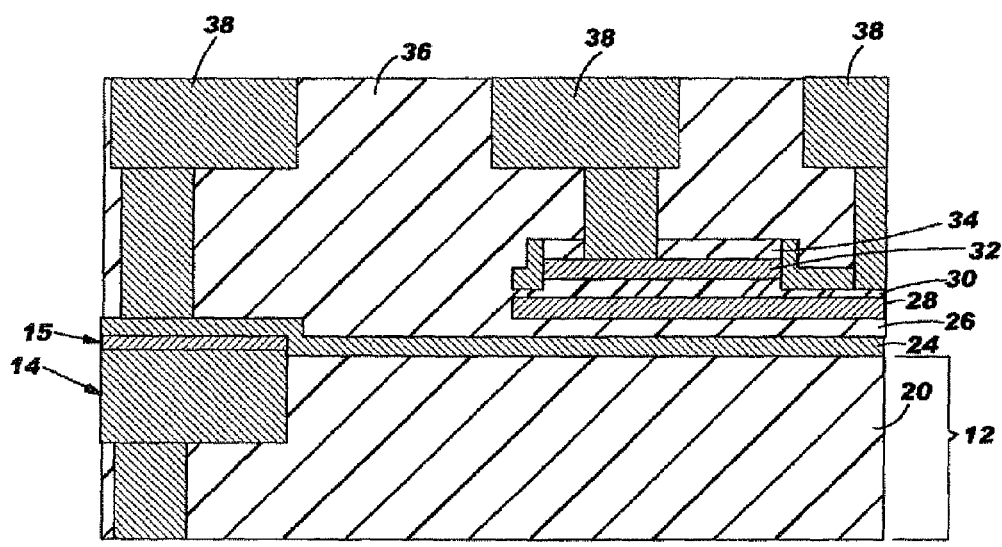

FIG. 1G shows the structure after forming the next interconnect level. In the drawing, reference numeral 36 denotes a dielectric that may be the same or different insulator as compared with the dielectric layer 20 and reference numeral 38 denotes the conductive interconnects in the next interconnect level. Note, that a top portion of the top plate electrode of the inventive MIM capacitor is in direct contact with one of the conductive interconnects. The next interconnect level is formed utilizing conventional processes well known to those skilled in the art.

The structure illustrated in FIG. 1F or 1G comprises a substrate 10 including a wiring level 12, the wiring level 12 comprising at least one conductive interconnect 14 formed in a recessed dielectric layer 20, wherein the at least one the conductive interconnect 14 has an upper surface 15 that is located above an upper surface of the recessed dielectric layer 20; a dielectric stack 22 located on the upper surface of the conductive interconnect 14 and the upper surface of said recessed dielectric layer 20; and a MIM capacitor (layers 32, 30 and 28) located on the dielectric stack 22.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A semiconductor structure comprising:
   a substrate including a dielectric layer and at least one conductive interconnect, wherein said at least one conductive interconnect is embedded in said dielectric layer and has an upper surface that is located above an upper surface of said dielectric layer;
   a dielectric stack located on said upper surface of said at least one conductive interconnect and said upper surface of said dielectric layer;
   a MIM capacitor located on said dielectric stack, wherein said MIM capacitor comprises a bottom plate electrode located on said dielectric stack, a capacitor dielectric located on said bottom plate electrode, and a top plate located on said capacitor dielectric; and
   an etch stop layer located on a top surface of said top plate electrode, wherein sidewalls of said etch stop layer, sidewalls of said top plate electrode, and first sidewalls of said capacitor dielectric are vertically coincident with one another, and wherein second sidewalls of said capacitor dielectric are located outside a periphery of said first sidewalls of said capacitor dielectric and below said sidewalls of said capacitor dielectric.

2. The semiconductor structure of claim 1 wherein the upper surface of the dielectric layer is from about 100 Å to about 500 Å below the upper surface of the at least one conductive interconnect.

3. The semiconductor structure of claim 1 wherein the at least one conductive interconnect comprises Cu lines and vias.

4. The semiconductor structure of claim 1 wherein said dielectric stack comprises a nitride and an oxide.

5. The semiconductor structure of claim 1 wherein said bottom plate electrode and top plate electrode comprise a conductive metal or metal alloy.

6. The semiconductor structure of claim 5 wherein said bottom plate electrode and said top plate electrode comprises one of TiN, Ti, TiSiN, TaN, Pt, Ir, Ru, W, Al, Au, Cu, Ta, or TaSiN.

7. The semiconductor structure of claim 5 wherein said bottom plate electrode comprises TiN/W/TiN.

8. The semiconductor structure of claim 5 wherein said top plate electrode comprises TiN.

9. The semiconductor structure of claim 1 wherein said capacitor dielectric comprises silicon nitride, $SiO_2$, $Al_2O_3$, $HFO_2$, $SiO_xN_y$, or $HFSiO_x$.

10. The semiconductor structure of claim 1 further comprising:
   another dielectric layer located on said dielectric stack and abutting said MIM capacitor; and
   at least another conductive interconnect embedded in said another dielectric layer.

11. The semiconductor structure of claim 10 wherein one of said at least another conductive interconnect contacts a top surface of said top plate electrode.

* * * * *